United States Patent [19]

Knickerbocker

[11] 4,293,174
[45] Oct. 6, 1981

[54] ELECTRICAL CIRCUIT TESTER

[75] Inventor: Robert H. Knickerbocker, Cheshire, Conn.

[73] Assignee: The Siemon Company, Watertown, Conn.

[21] Appl. No.: 943,231

[22] Filed: Sep. 18, 1978

[51] Int. Cl.³ .............................. H01R 21/28
[52] U.S. Cl. .............. 339/64 M; 339/150 B; 339/255 R
[58] Field of Search .......... 339/210 R, 210 M, 210 T, 339/206 R, 206 L, 206 P, 207, 209, 210, 255 R, 275, 48, 49 R, 64, 150 B

[56] References Cited

U.S. PATENT DOCUMENTS

| | | | |
|---|---|---|---|
| 2,736,870 | 2/1956 | De Jur et al. | 339/255 R |
| 3,412,367 | 11/1968 | Churla | 339/107 X |
| 3,864,629 | 2/1975 | Danna | 339/96 X |
| 4,002,389 | 1/1977 | Mammel | 339/103 M X |
| 4,179,171 | 12/1979 | Shannon | 339/255 R |

Primary Examiner—John McQuade
Assistant Examiner—John S. Brown
Attorney, Agent, or Firm—Fishman and Van Kirk

[57] ABSTRACT

An electrical circuit tester for use in testing terminal blocks having protruding electrical connectors, the tester comprising a body made from an insulating material, the body having a plurality of circuit testing assemblies, each assembly including a chamber, each chamber including a chamber extension extending to the exterior of the body and capable of receiving the electrical connectors. Positioned within each chamber is a piston having a piston rod extending therefrom, the piston rod extending into the chamber extension. The chamber includes a piston retaining wall having an aperture through which the piston rod moves. When the piston rod is in its fully extended state, there is room in the chamber extension to receive the electrical connector. Positioned within the chamber is a conductive grommet and a resilient conductive spring which contacts the grommet and functions to urge the piston and piston rod to the fully extended position. Conductors extend from the grommets to the exterior of the tester, and may eventually be connected to an electronic apparatus for testing the circuits in the telephone terminal blocks.

4 Claims, 6 Drawing Figures

ELECTRICAL CIRCUIT TESTER

BACKGROUND OF THE INVENTION (1) Field of the Invention

The present invention relates to testing of electrical circuitry. More particularly, the present invention relates to an apparatus for testing the wiring of a telephone terminal block of the type having a plurality of connectors extending therefrom. The apparatus of the present invention also relates to an electrical circuit testing device which allows for the establishment of electrical connection between the protruding connectors of a telephone terminal block and an electronic device which tests the wiring of the telephone terminal block.

(2) Description of the Prior Art

In the communications industry, more particularly in the telephone industry, terminal blocks having a plurality of clip-type electrical connectors protruding therefrom are used. One such terminal block is disclosed in U.S. Pat. No. 3,836,942 to Robert Knickerbocker. A similar type of terminal block is disclosed in U.S. Pat. No. 3,604,092 to Robert Knickerbocker. This later patent not only discloses a terminal block but also discloses a tool for inserting wires in the connectors of the terminal block.

The wiring of a terminal block is a complicated matter and is prone to mistakes. Thus, it is desirable to test the terminal blocks to be sure that the wires are connected to the proper electrical connector and that the wires are connected so as to make good electrical contact. It should be noted that electronic apparatus for testing the wiring of terminal blocks is available. However, such electronic apparatus must be connected to the various electrical connectors of the terminal block to allow for testing of the connections by the electronic apparatus.

One prior art method of testing the connections in a terminal block is to attach the testing wires leading from the electronic testing apparatus to the electrical connectors of the block by clips. It should be appreciated that this is a time consuming and arduous task which by its nature is subject to human error.

Another prior art test apparatus involves a test block which is the same size as the entire block to be tested. This test block has an array of contact elements that are force fitted over the connector elements of the terminal block, and the test block is secured to the terminal block by clamping arms and a clamping screw. The arms extend into openings in the terminal block and the clamping screw is torqued through the arms to load the test block against the terminal block. This test apparatus is bulky and cumbersome, both to mount and dismount. Furthermore, because of the force fit of test contacts over the connector elements of the terminal block, contact can only be made with every other connector in a row because of space limitations. Thus, individual rows cannot be tested (the entire terminal block must be tested as a unit), and even then only half the connectors in any row are actually tested.

It is one object of the present invention to provide an electrical circuit tester which can be easily connected to electrical conductors which protrude from a conventional terminal block.

It is another object of the present invention to provide an electrical circuit tester which can be affixed or connected to a plurality of electrical connectors, thereby reducing testing time, and insuring that the correct testing wire is associated with the correct electrical connector.

It is another object of the present invention to provide an electrical circuit tester having relatively few parts. It is still a further object of the present invention to fabricate a circuit tester from parts which are plastic and which can be molded by conventional techniques.

SUMMARY OF THE INVENTION

Although not limited thereto in its applicability, the electrical circuit tester of the present invention is particularly suited for use with telephone terminal blocks having a plurality of electrical connectors or clips protruding therefrom. However, it should be understood that the electrical circuit tester of the present invention is adaptable to various types of terminal blocks including a plurality of electrical connectors protruding therefrom.

The electrical circuit tester comprises a body made from insulating material, preferably plastic, which can be molded by conventional methods. The body has a plurality of circuit testing assemblies. Each assembly includes a chamber and a chamber extension having a diameter smaller than the chamber, the chamber extension extending to the exterior of the block and adapted to receive an electrical connector from the circuit block which is to be tested. Positioned within each chamber is a piston and piston rod, the pistons being movable within the chamber and the piston rods being movable through the chamber extension. The chamber includes a retaining wall for retaining the piston, the retaining wall including an aperture which allows the piston rod to move therethrough. The length of the piston rod and the positioning of the retaining wall is such that when the piston rod is in the fully extended position, a portion of the chamber extension is empty and thus is capable of receiving an electrical connector. Positioned within each chamber and urging the piston rod to the fully extended position is a resilient spring which is preferably conductive. Communication between the interior and exterior of the chambers may be by way of a conductive grommet which, within the chamber, contacts and thus forms an electrical circuit with the piston. Conductors will extend from the grommets to a conductor which may be coupled to apparatus for testing the circuitry in the terminal block.

In order to test the circuitry of the terminal block, the electrical connectors of the terminal block are positioned within the chamber extensions. The body of the electrical circuit tester is pushed toward the electrical connector and the springs resiliently deform and the pistons and the piston rods are caused to retract. Since the pistons, piston rods and springs are all preferably conductive, an electrical circuit is completed between the electrical connectors of the terminal block and the electronic testing apparatus. The electrical circuit tester according to the present invention is adaptable to a terminal block which has a plurality of electrical connectors some of which extend varying heights from the face of the terminal block. Thus, by including numerous independent circuit testing assemblies, the electrical circuit tester assures adequate connection of all of the electrical connectors which are to be tested.

In a particularly preferred embodiment of the invention, the body comprises three parts, all of which may be molded by conventional techniques. A first part of the tester is an elongated bar having a plurality of cylindrical chambers therein. The chambers include a cylindrical chamber extension which is open at the bottom of the body so as to receive electrical connectors from the terminal block. The diameter of the chamber extension is smaller than the diameter of the chamber thereby defining a retaining wall for the piston. The cylindrical chamber forms only a portion of the chamber which is adapted to hold the resilient conductive spring, the piston and the piston rod. In the preferred embodiment of the invention, the elongated bar is shaped on the chamber extension side thereof to receive electrical connectors. It should be understood that the electrical connectors described have a generally rectangular cross section. Thus, the bottom of the elongated bar includes a plurality of generally rectangularly shaped apertures that are aligned with the chamber extension so that when the electrical connectors are inserted in the apertures, the piston rod which is located in the chamber extension is pushed upwardly against the bias of the resilient conductive spring. In a particularly preferred embodiment of the invention the elongated bar has a generally rectangular cross section and further includes at the top thereof flanges or ledges which are intended to fit within grooves provided for in the second and third parts of the electrical circuit tester.

The second and third parts of the electrical circuit connector form an upper casing for the elongated bar previously discussed. In the particularly preferred embodiment of the invention, the second and third parts of the tester are identical, that is, the second and third parts may be formed from the same mold. However, it should be understood that in some applications it may be desirable to have second and third parts which are not identical. The two parts which form the upper casing of the electrical circuit tester include elongated grooves which are adapted to receive the elongated flange or ledge of the elongated bar. The second and third portions of the electrical circuit tester are a slight distance longer than the elongated bar. This additional distance provides for retaining grooves which terminate in retaining walls. When the flanges of the elongated bar are sandwiched between two retaining grooves and the second and third parts of the body are held in position with respect to one another by any means such as screws, the elongated bar is held rigidly in place with respect to the second and third parts of the body.

In order to simplify the description of the second and third parts of the body, only one part will be described in detail and will be referred to as an upper part. The upper part includes a plurality of portions of cylindrical chambers. The chambers in the upper part are generally semi-cylindrical in shape, so that when the two upper pieces are placed together they define a single cylindrical chamber. When this single chamber is positioned in place, it is directly above the cylindrical chamber of the elongated bar. Thus, the combination of the two upper parts and the bar piece define a cylindrical chamber which receives the piston. A portion of the chamber for the piston is formed from the two upper parts and another portion of the chamber for the piston is formed by the elongated bar. The upper portion of the chamber includes an aperture which allows a wire to be connected to the grommet and to be led from the body of the electrical tester.

A particularly desirable feature of the present invention is that the structure of the two upper parts and the elongated bar allows for the simple assemblage of the electrical circuit tester. In the process of assembly, the flange or ledge of the elongated bar is positioned within the groove of one of the upper parts. When the flange is positioned in the groove, the chambers in the elongated bar align with the chambers in the upper part. The pistons and piston rods are inserted in the chamber and chamber extension of the elongated bar. The springs are then inserted in the chambers defined by the elongated bar and the upper part. Wires are then attached by any suitable means to each of the grommets and are led outside of the body of the electrical circuit tester. Preferably, the wires make contact with the springs via small conductive grommets which fit in the apertures of the upper piece. Each spring bears against a grommet and a piston and the wires are connected to the grommets. When all of the springs are in place, and the grommets have been connected by conductive wire and the conductive wire is led out of the body, the second upper part may be positioned in face-to-face relation to the first upper part. The chambers of the second upper part complete the encapsulation of the spring thereby forming a cylindrical chamber.

DETAILED DESCRIPTION OF THE INVENTION

Figure 1:
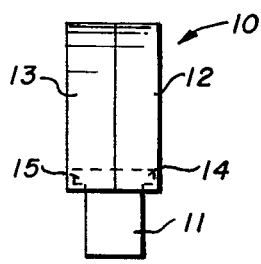
FIG. 1 is an end plan view of an electrical circuit tester.

Referring to all of the FIGURES simultaneously, the electrical circuit tester of the present invention includes a body 10 which is formed from three basic parts: an elongated bar 11, a first upper part 12 and a second upper part 13. Elongated bar 11 includes securement flanges 14 which are sized and shaped to be received in grooves 15 of upper parts 12 and 13. Grooves 15 are best shown in FIGS. 1 and 5.

Figure 2:
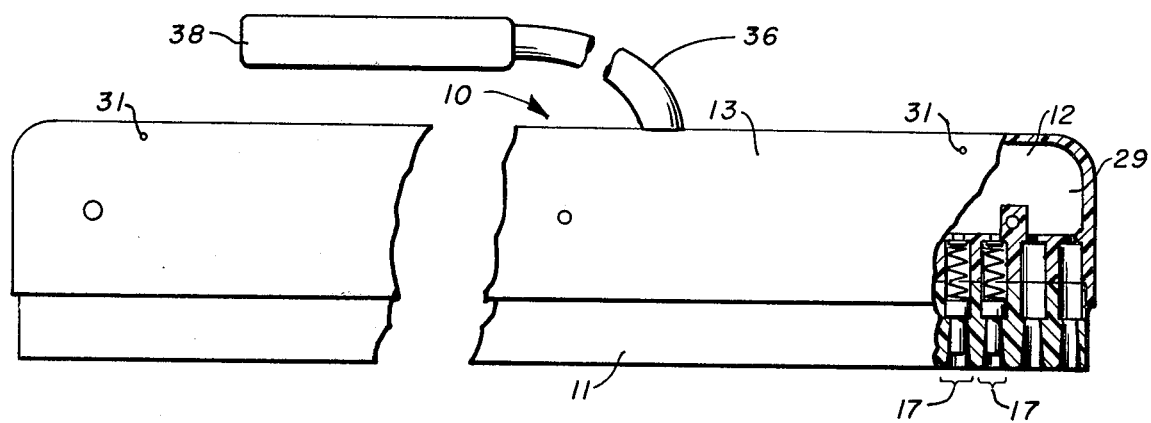
FIG. 2 is a side plan view of an electrical circuit tester, a portion of the body of the electrical circuit tester being broken away.
Figure 4:
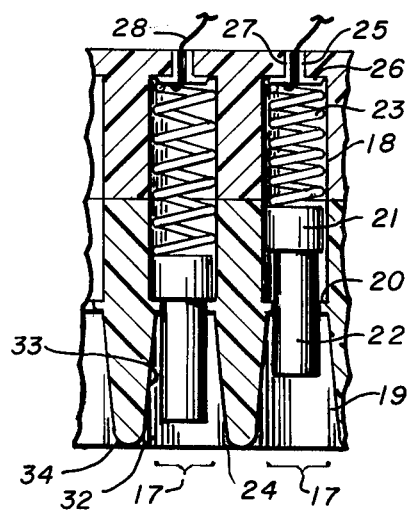
FIG. 4 is an enlarged view of the broken away portion of FIG. 2, FIG. 4 showing the pistons in two different positions.

The electrical circuit tester includes a plurality of circuit testing assemblies 17. It should be understood that the number of circuit testing assemblies included in any one electrical circuit tester depend upon the intended use of the tester. For long terminal blocks including many connector clips, a proportionately long circuit tester having many circuit testing assemblies would be necessary. The individual circuit testing assemblies 17 are best shown in FIG. 4 which is an expanded view of the cut-away portion shown in FIG. 2. Each circuit testing assembly 17 includes a chamber 18 which is preferably cylindrical and a chamber extension 19 which extends from the chamber 18. Chamber extension 19 has a diameter at the end adjacent chamber 18 which is less than the diameter of chamber 18. Because of this difference in diameter a retaining wall 20 is defined, retaining wall 20 functioning as a stop means for piston 21. Retaining wall 20 also includes an aperture through which piston rod 22 moves. Preferably, piston 21 is integral with piston rod 22. The piston and piston rod assembly should be capable of conducting electricity from the end of the piston rod which contacts the electrical connector to the end of the piston which contacts spring 23. Preferably the piston and piston rod assembly is made from brass that is tin plated. As shown in FIG. 4, the piston rod 22 extends only a portion of the length of chamber extension 19 when the piston rod 22 is in the fully extended position. This provides a small space 24 into which an electrical connector from a terminal block may be inserted. In the left-hand circuit testing assembly 17 shown in FIG. 4, the piston is in its fully extended position and spring 23 is compressed only slightly, and, in some instances, may not be compressed at all. The spring 23 can be electrically connected to the exterior of body 10 by any suitable means. As shown in FIG. 4, a particularly preferred means of providing for electrical connection of spring 12 is by the use of a conductive grommet 25 which has a face 26 which contacts spring 23 and which has a tubular portion 27 which extends to the exterior of chamber 18. Wire 28 is connected to grommet 25 by any suitable means such as soldering. The wire 28 is led into a recess 29 in upper parts 12 and 13 (the recess is best shown in FIGS. 2 and 5). Wires 28 are led through recess 29 to aperture 30 and eventually to a conventional electronic testing apparatus. Each upper part 12 and 13 includes two aperture defining cut-outs. When part 13 is aligned with part 12, two apertures 30 are provided. Although in most instances one aperture 30 is sufficient for the wires to be led to the electronic testing apparatus, it is desirable to include two apertures 30 so that the same mold may be used for the upper part 12 and upper part 13. If one aperture is not used, it may be plugged by any means such as a suitable rubber plug.

In order to test the circuitry of the terminal block, the electrical connectors of the terminal block are positioned within the chamber extensions 19. The body of the electrical circuit tester is pushed toward the electrical connector and the springs resiliently deform and the pistons and the piston rod retract. FIG. 4 shows a circuit tester assembly 17 with the piston rod 22 in a retracted position. Since the piston 21, piston rod 22, and spring 23 are conductive, an electrical circuit is made between the electrical connectors of the terminal block and the electronic testing apparatus. The electrical circuit tester according to the present invention is adaptable to a terminal block which has a plurality of electrical connectors some of which extend varying heights from the face of the terminal block. Thus, by including numerous independent circuit testing assemblies, the electrical circuit tester assures adequate connection of all of the electrical connectors which are to be tested.

Figure 5:
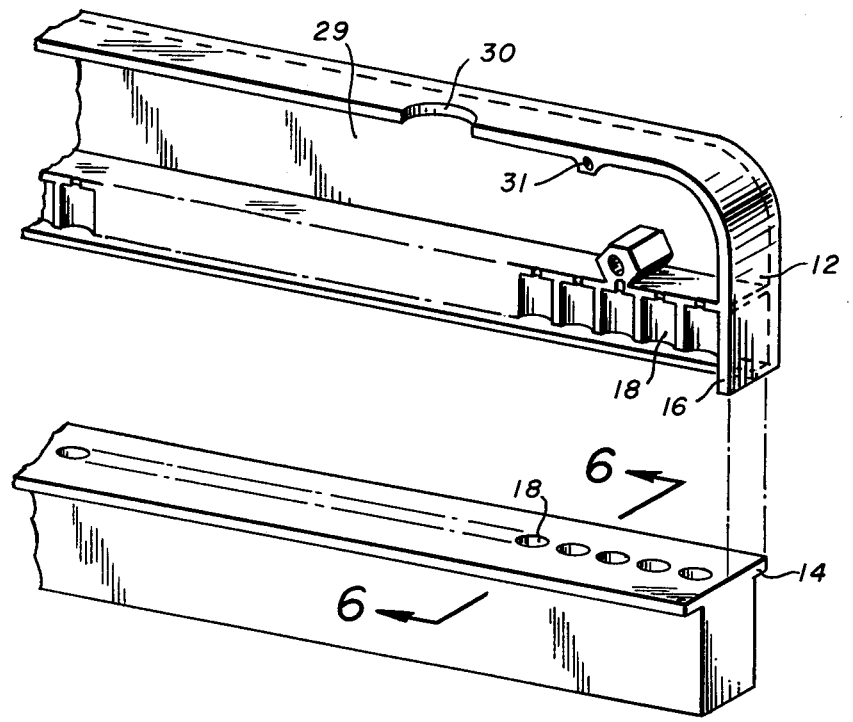
FIG. 5 is a perspective view of an elongated bar piece and one upper part of the electrical circuit tester shown in the preceding FIGURES.
Figure 6:
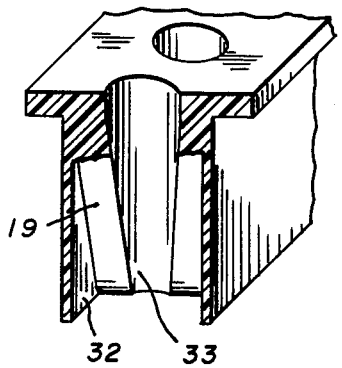
FIG. 6 is a sectional view along the lines 6—6 in FIG. 5.

As shown in FIGS. 4, 5 and 6, chamber 18 is formed from a combination of the two upper parts 12 and 13 and the elongated bar 11. When flange 14 is inserted into groove 15, the lower portion of chamber 18 in elongated bar 11 is aligned with the upper portion of chamber 18 in upper part 12 thereby reducing the time required to align the pieces. Dowels 31 in upper parts 12 and 13 provide for alignment of parts 12 and 13 and the formation of the upper part of chamber 18. Walls 16 abut flanges 14 and prevent sliding of flanges 14 in grooves 15. Preferably, prior to the insertion of the flange of elongated bar 11 into groove 15 of upper part 12, the piston and piston rod assemblies are put within each chamber and chamber extension. When only one upper part 12 is in position, the springs 23 may be inserted within each chamber. The grommets 25 and the electrical wires may be connected before or after elongated bar 11 is attached to upper piece 12. The wires which are connected to the various grommets 25 are led through aperture 30 to the outside of body 10. The second upper piece 13 is then positioned in place and springs 23, piston 21, piston rod 22, grommet 25 and wires 28 are maintained in place and an enclosed chamber 18 is formed. The wires are formed in a multiwire cable 36 which ends in a 50 pin unitary connector 38.

Figure 3:
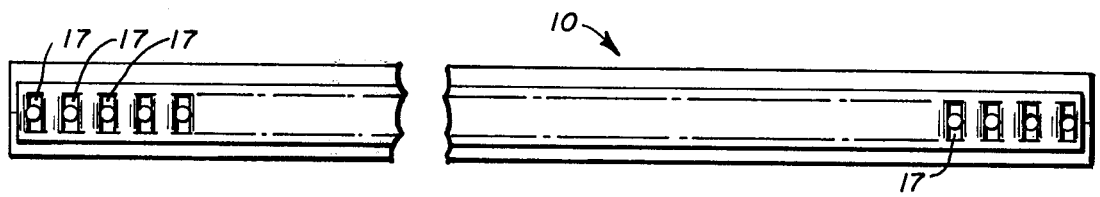
FIG. 3 is a bottom plan view of the electrical circuit tester.

As best shown in FIGS. 3 and 6, the chamber extension is adapted to receive a particular type of electrical connector. In the embodiment shown, the electrical circuit tester is adapted to be used with a clip having a generally rectangular shape. Thus, chamber extension 18 has a generally rectangular shape. However, it should be understood that the shape of chamber extension 19 should be designed so as to fit over a particular connector.

Referring to FIGS. 4 and 6, particularly useful feature of the present invention is shown. It should be understood that the clip-type electrical connectors which protrude from a conventional terminal block may vary in spacing between the connectors due to factors such as manufacturing tolerances. In order to accommodate such variations in spacing of the clip-type connectors, the portion of the chamber extension 19 which receives the clip narrows. That is, the entrance to each chamber extension 19 is radiused and wide at the exterior to form a lead in portion which tapers to a narrower portion near retainer or shoulder 20. Thus, when a clip is inserted in the chamber extension 19, the top of the clip is directed by the walls of the chamber extension 19 to a position where the clip contacts piston rod 22. The radius and tapering can be seen by reference to side wall 32 and wall 33 of chamber extension 19 and end portion 34.

The clip-type connectors shown in U.S. Pat. No. 3,836,942 may face in opposite directions in rows or within rows in a given block. The chamber extensions 18 and the piston rods 22 are proportioned to insure that the clip will contact the piston rod regardless of the direction of the clip.

It should be understood that upper parts 12 and 13 may be held together by any suitable means, such as, for example, screws which may be unscrewed to provide an access to the internal parts of the tester. However, it should also be understood that an adhesive may be used to secure the upper parts 12 and 13 together.

In summary, the electrical circuit tester of the present invention has a particularly simple structure which allows it to be adapted to various types of connectors. For any given type of connector, the individual circuit assemblies adapt to a particular electrical connector. Thus, in circuit blocks where the electrical connectors are of different heights, the electrical circuit tester of the present invention may be used. Another important advantage of the structure of the electrical circuit tester is that it allows for simple fabrication. The parts of the body can be formed by conventional molding techniques, and, in the most preferred embodiment of the invention, the two upper parts may be made in an identical mold. During assembly of the various parts, the flange and groove assembly allows for alignment of the top and bottom parts of chamber 18 thus reducing assemblage time. Furthermore, once only one upper piece 12 or 13 is associated with elongated bar 11, the springs may be easily inserted and retained within the chamber 18.

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. Apparatus for simultaneously establishing electrical contact with a plurality of linearly arranged conductive terminals of uneven height which protrude from a substrate, said apparatus enabling the testing of circuitry connected to said terminals, the apparatus comprising:

elongated bar means, said bar means being comprised of a non-conductive material, said bar means defining a linear array of chambers, said chambers each having an axis and the axes of said chambers being substantially parallel, said bar means further defining extensions of said chambers having a variable cross-sectional area, the first larger cross-sectional area ends of said chamber extensions lying in the plane of a first exterior surface of said bar means whereby terminals protruding from a substrate may be guided by a wall of said chamber extensions toward the chamber axis, first ends of the said chambers and the second ends of said chamber extension being in communication via apertures having a smaller cross-sectional area than the adjacent chamber whereby a shoulder is defined at the said first ends of said chambers;

electrically conductive piston means disposed for axial movement in each of said chambers, said piston means being dimensioned such that movement thereof in a first direction will be limited by said shoulders, said piston means being of shorter axial length than each of said chambers;

electrically conductive piston rod means, said piston rod means comprising conductive extensions of said piston means, said piston rod means extending into said chamber extensions via said apertures for contacting a terminal, said piston rod means being of smaller diameter than said piston means;

electrically conductive spring means positioned in said chambers to resiliently bias said piston means toward the first ends of said chambers, said spring means allowing said piston means to retract when said piston rod means contact a terminal, said spring means defining conductive paths from said piston rod means to the second ends of said chambers;

means cooperating with said bar means to define an elongated cavity, at least a portion of a second exterior surface of said bar means disposed oppositely to first exterior surface being located within said cavity; and means extending into the second ends of said chambers for electrically connecting said spring means to individual conductors of a multi-conductor cable of a test instrument, said cable being partly positioned in said cavity.

2. The apparatus of claim 1 wherein said chamber extensions have a generally rectangular cross-sectional shape and wherein the variable cross-sectional area of said chamber extensions is defined by tapering walls which separate adjacent chamber extensions of the array.

3. The apparatus of claim 2 wherein said piston rod means have a shorter axial length than said chamber extensions.

4. The apparatus of claim 3 wherein said connecting means further comprises:

an array of apertures extending between said bar means chambers and said bar means second exterior surface; and means establishing an electrical connection to said spring means via said apertures.

* * * * *